(12) United States Patent
Jitsumori et al.

(10) Patent No.: US 6,232,791 B1
(45) Date of Patent: May 15, 2001

(54) TESTING BOARD

(75) Inventors: Kenro Jitsumori; Kenji Furumoto, both of Osaka; Shoichi Tanaka, Kyoto; Tomoyuki Nakayama, Osaka; Mikiya Mai, Kyoto; Tugio Murayama, Shiga, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/353,371

(22) Filed: Jul. 14, 1999

(30) Foreign Application Priority Data

Oct. 27, 1998 (JP) ................................................. 10-304836
May 18, 1999 (JP) ................................................. 11-137022

(51) Int. Cl.$^7$ ................................................. G01R 31/26
(52) U.S. Cl. ........................................... 324/765; 324/755
(58) Field of Search ............................... 324/765, 755, 324/763, 754

(56) References Cited

U.S. PATENT DOCUMENTS 6,046,598 * 4/2000 Miyaji et al. .......................... 324/755

* cited by examiner

Primary Examiner—Safet Metjahic
Assistant Examiner—J Kerveros
(74) Attorney, Agent, or Firm—Eric J. Robinson; Nixon Peabody LLP

(57) ABSTRACT

A testing board for testing the electric characteristics of semiconductor integrated circuit elements by applying a voltage to each of the testing electrodes of the semiconductor integrated circuit elements comprises a wiring board having a wiring layer at the surface thereof opposing the semiconductor integrated circuit elements. An elastic sheet is disposed in spaced relation to the opposing surface of the wiring board. Probe terminals are disposed on the surface of the elastic sheet opposing the semiconductor integrated circuit elements to correspond to the testing electrodes. A conductive wire has both end portions joined to the wiring layer of the wiring board and a middle portion spaced from the opposing surface of the wiring board. An elastic member for biasing the conductive wire such that the middle portion of the conductive wire is brought into contact with the probe terminal is disposed between the wiring board and the conductive wire.

7 Claims, 6 Drawing Sheets

TESTING BOARD

BACKGROUND OF THE INVENTION

The present invention relates to a testing board for testing the electric characteristics of semiconductor integrated circuit elements by applying a voltage to each of the testing electrodes of the semiconductor integrated circuit elements.

In the process of fabricating a conventional semiconductor integrated circuit device, an electrical connection is provided between a semiconductor chip and a leadframe by a bonding wire and then the semiconductor chip and the leads of the leadframe are sealed with a resin or ceramic to be mounted on a printed circuit board.

To meet the demand for an electronic device reduced in both size and price, there has been developed a method of mounting, on a circuit board, a semiconductor integrated circuit element as a bare chip cut out of a semiconductor wafer. The bare chip used in the method is preferably a quality-assured bare chip supplied at lower price.

In accordance with a known testing method, a burn-in process is performed with respect to semiconductor integrated circuit elements by using a testing board having probe terminals to be connected to the testing electrodes of the semiconductor integrated circuit elements. FIGS. 5 and 6 show a testing board that has been proposed for use in the testing method.

One type of testing board to be provided by the present invention is for performing a wafer-level test with respect to a plurality of semiconductor integrated circuit elements formed in a semiconductor wafer such that the electric characteristics thereof are tested simultaneously. The other type of testing board to be provided by the present invention is for individually testing the electric characteristics of semiconductor packages having semiconductor integrated circuit elements (semiconductor chips) cut out of a semiconductor wafer and covered with resin packages. FIG. 5 shows a cross-sectional structure of a testing board for performing a wafer-level test with respect to a plurality of semiconductor integrated circuit elements formed in a semiconductor wafer such that the electric characteristics thereof are tested simultaneously. In this case, FIG. 6 shows an enlarged cross-sectional structure of the portion enclosed in the dot-dash box in FIG. 5.

As shown in FIGS. 5 and 6, a large number of testing electrodes 2 are provided on the surface of a semiconductor wafer 1 formed with a plurality of semiconductor integrated circuit elements. The peripheral portions of the testing electrodes 2 are covered with a passivation film 3.

As shown in FIG. 5, a ring-shaped seal member 5 composed of an elastic material is provided around a wafer mount portion 4a of a wafer tray 4 for holding the semiconductor wafer 1. An open/close valve 6 is provided at an appropriate portion of a side surface of the wafer tray 4 to be connected to evacuating means not shown. A ring-shaped evacuation groove 7 connecting to the open/close valve 6 is formed between the wafer mount portion 4a of the wafer tray 4a and the seal member 5.

A testing board E is provided in opposing relation to the semiconductor wafer 1 held by the wafer tray 4. The testing board E comprises: a wiring board 50 having a wiring layer 50a; an elastic sheet 52 composed of, e.g., a polyimide sheet fixed to the wiring board 50 by means of a rigid ring 51; hemispherical probe terminals 53 disposed on the elastic sheet 52 to correspond to the testing electrodes 2 on the semiconductor wafer 10; and an anisotropic conductive rubber sheet 54 for providing an electric connection between one end of the wiring layer 50a of the wiring board 50 and each of the probe terminals 53. As shown in FIG. 6, numerous conductive particles 55 are provided within the anisotropic conductive rubber sheet 54 in mutually connected relation, whereby electric connections are provided between the wiring layer 50a of the wiring board 50 and the probe terminals 53.

The other end of the wiring layer 50a of the wiring board 50 is connected to a testing apparatus for supplying a testing voltage such as a power-source voltage, a ground voltage, or a signal voltage, which is not shown.

As stated previously, in the case where a wafer-level test is performed simultaneously with respect to the plurality of semiconductor integrated circuit elements in the semiconductor wafer 1, a sealed space 56 is defined by the wafer tray 4, the seal member 5, and the elastic sheet 52 if the wafer tray 4a and the wiring board 50 are brought closer to each other. If the sealed space 56 is evacuated via the open/close valve 6 connected to the evacuating means not shown, the wafer tray 4a and the elastic sheet 52 are brought much closer to each other, which provides an electric connection between each of the testing electrodes 2 on the semiconductor wafer 1 and the corresponding probe terminal 53. Thereafter, a testing voltage is applied from the testing apparatus to each of the testing electrodes 2 on the semiconductor wafer 1 and an output signal from each of the testing electrodes 2 is inputted to the testing apparatus, whereby each of the semiconductor integrated circuit elements formed on the semiconductor wafer 1 is tested for electric characteristics by the testing apparatus.

When the testing electrodes 2 on the semiconductor wafer 1 and the corresponding probe terminals 53 are brought into contact with each other by evacuating the sealed space 56, a problem arises if the heights of the testing electrodes 2 or probe terminals 53 vary. However, since the height variations can be accommodated by elastic deformation of the anisotropic conductive rubber sheet 54 interposed between the wiring layer 50a of the wiring board 50 and the probe terminals 53, an electric connection is provided reliably between each of the testing electrode 2 on the semiconductor wafer 1 and the corresponding probe terminal 53 of the testing board E.

As described above, electrical continuity between the wiring layer 50a of the wiring board 50 and the probe terminals 53 is produced by the numerous conductive particles 55 disposed within the anisotropic conductive rubber sheet 54, so that the resistance of the anisotropic conductive rubber sheet 54 is determined by the filling factor of the conductive particles 55. However, variations in the filling factor of the conductive particles 55 cause variations in the resistance of the anisotropic conductive rubber sheet 54, which necessitates a difficult operation for controlling the filling factor of the conductive particles 55.

Moreover, a small contact area between the conductive particles 55 makes it difficult to reduce the resistance of the anisotropic conductive rubber sheet 54a and therefore the contact resistance between the wiring layer 50a of the wiring board 50 and the probe terminals 53.

As stated previously, the sealed space 56 should be evacuated with a large evacuation force to ensure contact between each of the testing electrodes 2 of the semiconductor wafer 1 and the corresponding probe terminal 53 of the testing board E. The evacuation of the sealed space 56 is performed repeatedly every time the semiconductor wafer 1 is tested and a load is repeatedly placed on the anisotropic conductive rubber sheet 54 on each evacuation. Consequently, the anisotropic conductive rubber sheet 54 is plastically deformed and reliable contact is no more provided between the testing electrodes 2 and the probe terminals 53 or the arrangement of the numerous conductive particles 55 provided within the anisotropic conductive rubber sheet 54a is disordered, which varies the resistance between the wiring layer 50a and the probe terminal 53.

Since the higher integration of the semiconductor integrated circuit elements formed in the semiconductor wafer 1 reduces the pitch of the adjacent testing electrodes 2 and therefore the pitch of adjacent rows in which the conductive particles 55 provided within the anisotropic conductive rubber sheet 54 are arranged, the arrangement of the conductive particles 55 is disordered when the anisotropic conductive rubber sheet 54 is elastically deformed, which brings the conductive particles 55 in the adjacent rows closer to or even in contact with each other and fluctuates electrical continuity between the wiring layer 50a and the probe terminals 53.

As shown in FIG. 6, the contact area between each of the probe terminals 53 and the corresponding testing electrode 2 is large due to the hemispherical configuration of the probe terminal 53. Moreover, the probe terminal 53 has a smooth surface. Accordingly, even when the probe terminal 53 is pressed against the testing electrode 2 under a specified pressure, if a coating composed of a natural oxide film or a contaminant film is adhered to the surface of the testing electrode 2, reliable contact is no more provided between the probe terminal 53 and the testing electrode 2.

SUMMARY OF THE INVENTION

In view of the foregoing, it is therefore a first object of the present invention to suppress the lowering of the resistance between the wiring layer of a wiring board and the probe terminals of a testing board, reduce resistance variations, and produce stable electrical continuity between the wiring layer and the probe terminals. A second object of the present invention is to provide reliable contact between each of the probe terminals and the corresponding testing electrode even when a coating is formed on the surface of the testing electrode.

To attain the first object, a first testing board according to the first embodiment is for testing electric characteristics of semiconductor integrated circuit elements by applying a voltage to each of testing electrodes of the semiconductor integrated circuit elements, the testing board comprising: a wiring board having a wiring layer on a surface thereof opposing the semiconductor integrated circuit elements; an elastic sheet disposed in spacing relation to the opposing surface of the wiring board; probe terminals disposed on a surface of the elastic sheet opposing the semiconductor integrated circuit elements to correspond to the testing electrodes; a conductive wire having both end portions joined to the wiring layer of the wiring board and a middle portion spaced from the opposing surface of the wiring board; and an elastic member disposed between the wiring board and the conductive wire to bias the conductive wire such that the middle portion of the conductive wire is brought in contact with the corresponding one of the probe terminals.

In the first testing board, there are provided the conductive wire having the both end portions joined to the wiring layer of the wiring board and the middle portion spaced from the opposing face of the wiring board and the elastic member for biasing the conductive wire such that the middle portion of the conductive wire is brought in contact with the corresponding one of the probe terminals. Since an electrical connection is provided between the wiring layer of the wiring board and each of the probe terminals via the conductive wire, conductive particles disposed within a conductive rubber member to provide electrical connections between the wiring layer of the wiring board and the probe terminals are no more necessary.

To attain the first object, a second testing board according to the present invention is for testing electric characteristics of semiconductor integrated circuit elements by applying a voltage to each of testing electrodes of the semiconductor integrated circuit elements, the testing board comprising: a main board; an elastic wiring sheet disposed on a surface of the main board opposing the semiconductor integrated circuit elements and internally formed with a wiring layer; and probe terminals disposed on a surface of the wiring sheet opposing the semiconductor integrated circuit elements to correspond to the testing electrodes, the probe terminals being electrically connected to the wiring layer of the wiring sheet.

In the second testing board, the wiring layer is provided within the elastic wiring sheet and the probe terminals are connected directly to the wiring layer of the wiring sheet. Accordingly, conductive particles disposed within the conductive rubber member to provide electric connections between the wiring layer of the wiring board and the probe terminals are no more necessary.

To attain the first object, a third testing board according to the present invention is for testing electric characteristics of semiconductor integrated circuit elements by applying a voltage to each of testing electrodes of the semiconductor integrated circuit elements, the testing board comprising: a wiring board having a wiring layer on a surface thereof opposite to the semiconductor integrated circuit elements; an elastic sheet disposed on a surface of the wiring board opposing the semiconductor integrated circuit elements; probe terminals disposed on a surface of the elastic sheet opposing the semiconductor integrated circuit elements to correspond to the testing electrodes; and a conductive wire extending through the wiring board and connecting the corresponding one of the probe terminals to the wiring layer of the wiring board.

Since the third testing board comprises the conductive wire extending through the wiring board and connecting the probe terminal to the wiring layer of the wiring board, conductive particles disposed within the conductive rubber member to provide electric connections between the probe terminal and the wiring layer of the wiring board are no more necessary.

Since the first to third testing board no more need conductive particles disposed within an anisotropic conductive rubber sheet to provide electrical connections between the probe terminals and the wiring layer of the wiring board, variations in the resistance of the anisotropic conductive rubber sheet caused by variations in the filling factor of the conductive particles and by the disordered arrangement of the conductive particles are reduced and the operation for controlling the filling factor of the conductive particles is no more necessary.

With the first to third testing boards, therefore, the resistance between the wiring layer and the probe terminals and variations in the resistance therebetween can be reduced, while stable electrical continuity is established between the wiring layer and the probe terminals and reliable contact is provided between the probe terminals and the testing electrodes of the semiconductor wafer.

With the first testing board, in particular, the contact resistance between the wiring layer and the probe terminal can be reduced stably, since an electrical connection is provided between the wiring layer of the wiring board and the probe terminal via the conductive wire. Moreover, since the conductive wire is biased by the elastic member such that the middle portion thereof is kept in contact with the probe terminal, a reliable connection is provided between the conductive wire and the probe terminal even if the elastic sheet holding the probe terminal moves closer to or away from the semiconductor wafer.

With the second testing board, in particular, the contact resistance between the wiring layer and the probe terminal can be reduced stably since the wiring layer is provided within the elastic wiring sheet and the probe terminal is connected directly to the wiring layer of the wiring sheet. Moreover, there is no possibility of electrical continuity between the adjacent probe terminals even if the pitch of the probe terminals is reduced with the higher integration of the semiconductor wafer.

With the third testing board, in particular, the contact resistance between the wiring layer of the wiring board and the probe terminal can be reduced stably since an electric connection is provided between the wiring layer of the wiring board and the probe terminal by the conductive wire extending through the wiring board. Moreover, there is no possibility of electric continuity between the adjacent probe terminals even if the pitch of the probe terminals is reduced with the higher integration of the semiconductor wafer.

Preferably, the second testing board further comprises an elastic member located between the main board and the wiring sheet. In the arrangement, more reliable electric connections are provided between the probe terminals and the testing electrodes since the elastic member accommodates variations in the distance between the board and each of the probe terminals.

Preferably, the third testing board further comprises an elastic member located between the wiring board and the elastic sheet. In the arrangement, more reliable electric connections are provided between the probe terminals and the testing electrodes since the elastic member accommodates variations in the distance between the board and each of the probe terminals.

To attain the second object, a fourth testing board according to the present invention is for testing electric characteristics of semiconductor integrated circuit elements by applying a voltage to each of testing electrodes of the semiconductor integrated circuit elements, the testing board comprising: a wiring board or wiring sheet having a wiring layer; and probe terminals disposed on a surface of the wiring board or wiring sheet opposing the semiconductor integrated circuit elements to correspond to the testing electrodes, the probe terminals being electrically connected to the wiring layer, conductive particles being adhered to at least a tip surface of each of the probe terminals.

In the fourth testing board, the conductive particles are adhered to at least the tip surface of each of the probe terminals so that a coating composed of a natural oxide film or a contaminant film formed on the surface of each of the testing electrodes is torn by the particles. This provides reliable contacts between the probe terminals and the testing electrodes.

In the fourth testing board, it is preferred that the conductive particles are also provided within each of the probe terminals. In the arrangement, the particles provided within the probe terminals are exposed gradually even if the tip surfaces of the probe terminals are abraded and the particles adhered to the tip surfaces come off, so that reliable contacts are maintained between the probe terminals and the testing boards over a long period of time.

BRIEF DESCRIPTION OF THE DRAWINGS

FIGS. 1(a) and 1(b) are cross-sectional views showing a principal portion of a testing board according to a first embodiment of the present invention, of which FIG. 1(b) is a cross section taken along the line 1b—1b of FIG. 1(a);

DETAILED DESCRIPTION OF THE INVENTION

Embodiment 1

Referring to FIGS. 1, a testing board according to a first embodiment of the present invention will be described.

Figure 1A:
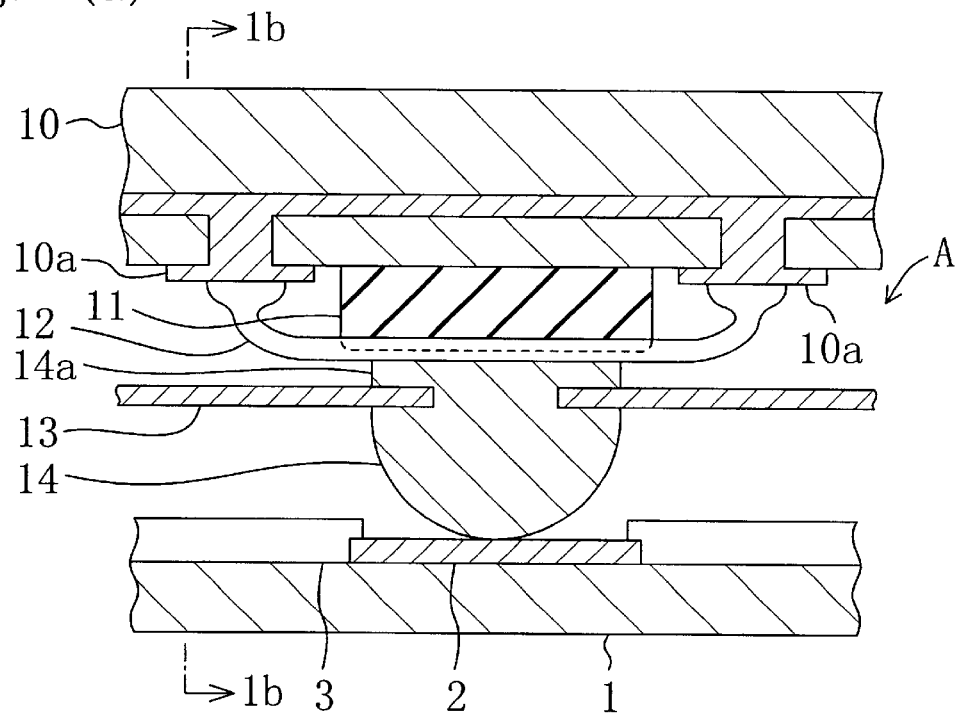
Figure 1B:
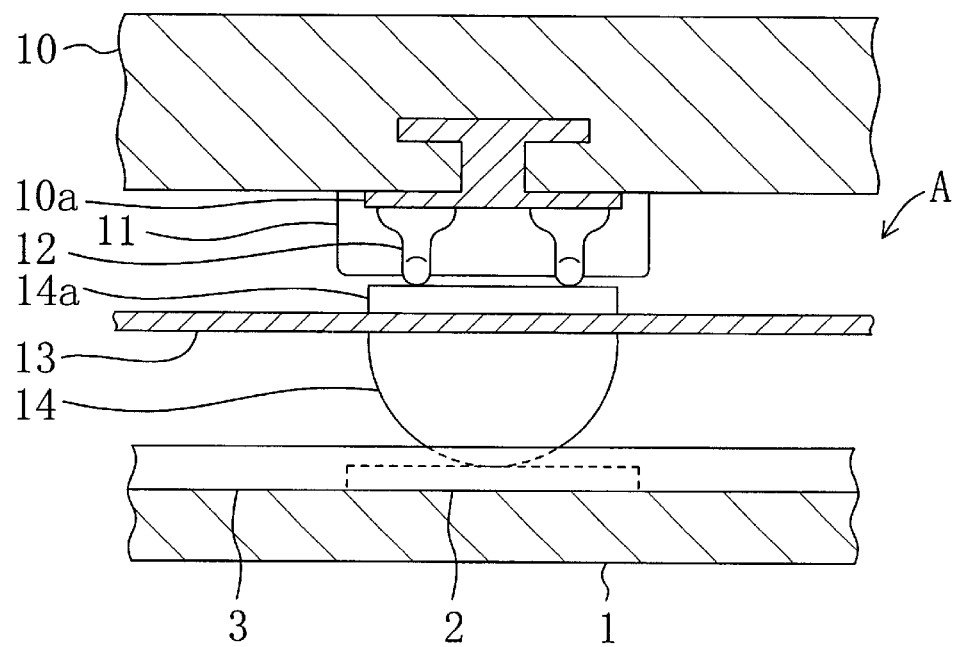
Figure 5:
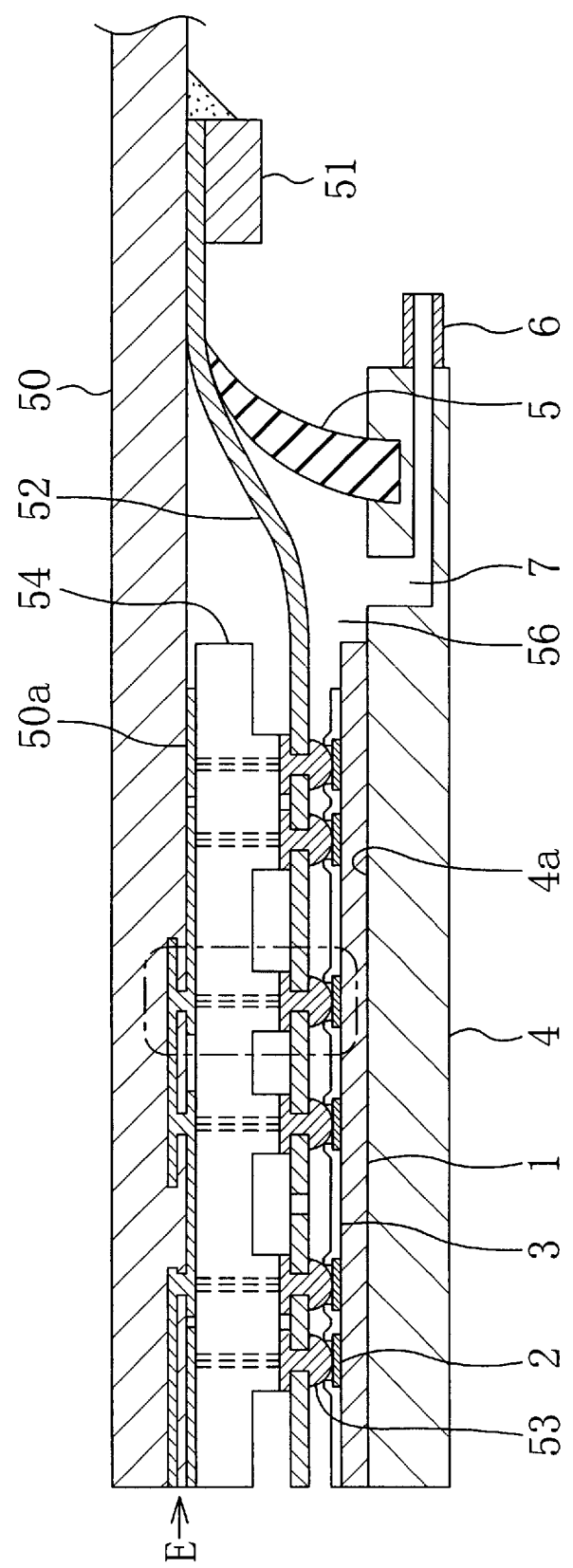
FIG. 5 is a cross-sectional view illustrating a method of testing the electric characteristics of semiconductor integrated circuit elements formed in a semiconductor wafer by means of a conventional testing board.
Figure 6:
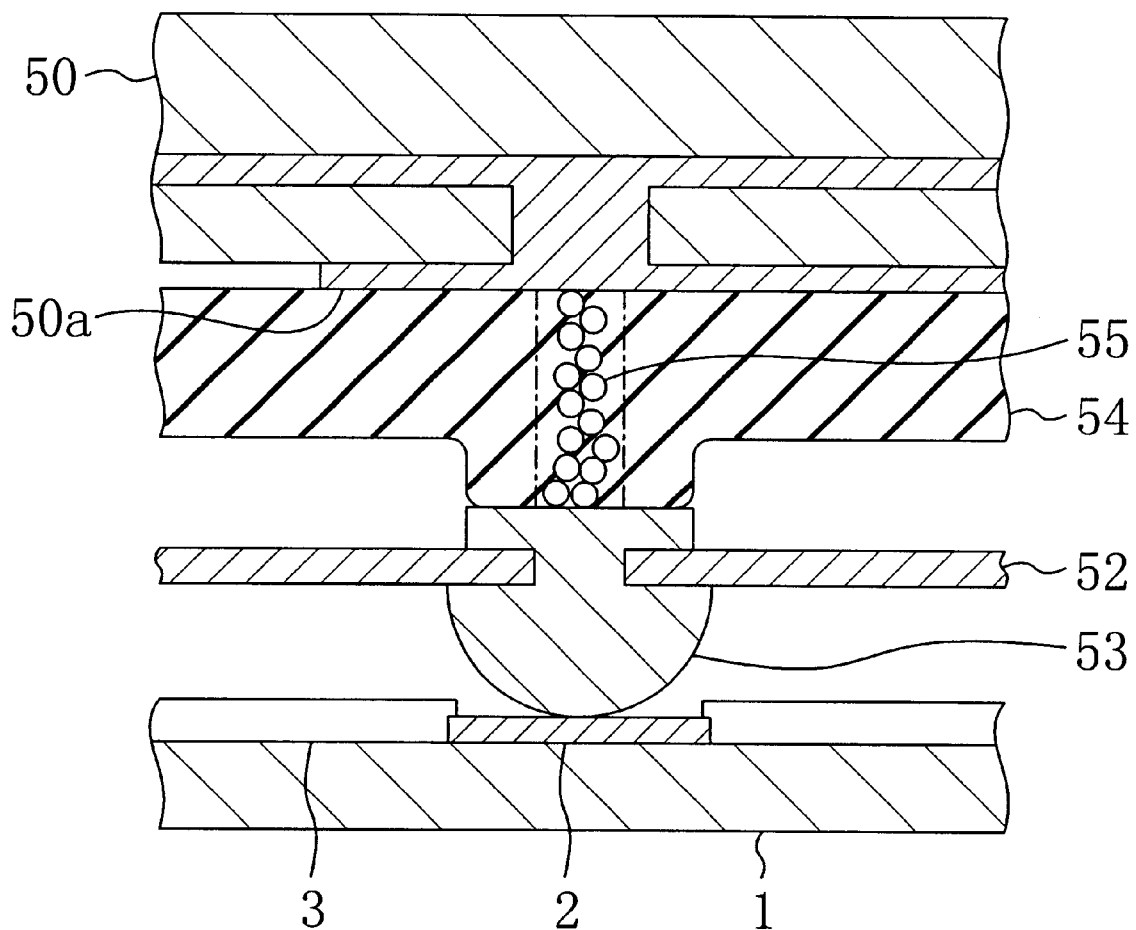
FIG. 6 is a cross-sectional view showing a principal portion of the conventional testing board.

FIGS. 1(a) and 1(b) show a cross-sectional structure of a principal portion of a testing board A according to the first embodiment, of which FIG. 1(a) corresponds to the portion enclosed in the dot-dash box in FIG. 5 and FIG. 1(b) shows a cross-sectional structure taken along the line 1b—1b of FIG. 1(a). It is to be noted that a large number of testing electrodes 2 are provided on the surface of a semiconductor wafer 1 formed with a plurality of semiconductor integrated circuit elements and the peripheral portions of the testing electrodes 2 are covered with a passivation film 3, similarly to FIG. 5. However, there are also cases where the peripheral portions of the testing electrodes 2 are not covered with the passivation film 3. The semiconductor wafer 1 is held by a wafer tray having the structure shown in FIG. 5.

As shown in FIGS. 1(a) and 1(b), a wiring layer 10a made of, e.g., copper is formed within and on the surface of an insulating wiring board 10. As shown in FIG. 1(a), the portions of the wiring layer 10a formed on the surface of the wiring board 10 are disposed separately on the right and left hands of the portion thereof opposing the corresponding one of the testing electrodes 2 of the semiconductor wafer 1.

Each of elastic members 11 made of, e.g., rubber is fixed to the surface portion of the wiring board 10 opposing the corresponding testing electrode 2 of the semiconductor wafer 1. The righthand and lefthand portions of the wiring layer 10a formed on the surface of the wiring board 10 are connected to each other with, e.g., two conductive wires 12 which extend over the elastic member 11. In this case, since the conductive wires 12 are connected to the righthand and lefthand portions of the wiring layer 10a in such a manner as to sink into the elastic member 11, the conductive wires 12 are biased toward the semiconductor wafer 1 (i.e., biased in a direction away from the wiring board 10), while they are prevented from swinging in the lateral direction (from side to side in FIG. 1(b)). The conductive wires 12 may have respective ends connected to the righthand and lefthand portions of the wiring layer 10a by, e.g., wire bonding or like method.

An elastic sheet 13 composed of, e.g., polyimide is provided in spaced relation to the wiring board 10. The peripheral portions of the elastic sheet 13 is fixed to the wiring board 10 in the same manner as used to fix the elastic sheet 52 shown in FIG. 5.

Hemispherical probe terminals 14a are formed by plating at the side (front side) of the elastic sheet 13 opposing the semiconductor wafer 1 to correspond to the testing electrodes 2. Each of the probe terminals 14 has a backside portion 14a which expands laterally after extending through the elastic sheet 13. With the elastic sheet 13 held between the backside portions 14a and main body portions of the probe terminals 14, the probe terminals 14a are held by the elastic sheet 13. With the backside portions 14a of the probe terminals 14 kept in contact with the conductive wires 12, electrical continuity is established between the probe terminals 14a and the conductive wires 12 and between the probe terminals 14a and the wiring layer 10a of the wiring board 10.

Thus, the testing board A is composed of: the wiring board 10 having the wiring layer 10a; the elastic members 11; the conductive wires 12; the elastic sheet 13; and the probe terminals 14.

Similarly to the description given above with reference to FIG. 5, if the wafer tray holding the semiconductor wafer 1 and the wiring board 10 of the testing board A are brought closer to each other, a sealed space is defined by the wafer tray, the seal member provided in the wafer tray, and the elastic sheet 13 of the testing board A. If the sealed space is evacuated, the wafer tray and the elastic sheet 13 are brought much closer to each other, so that the testing electrodes 2 of the semiconductor wafer 1 held by the wafer tray and the probe terminals 14 of the testing board A are connected to each other. In this case, since the conductive wires 12 are biased toward the semiconductor wafer 1, reliable connections are provided between the conductive wires 12 and the backside portions 14a of the probe terminals 14, so that the probe terminals 14 are also electrically connected to the wiring layer 10a of the wiring board 10.

In this state, a testing voltage is applied from a testing apparatus to each of the testing electrodes 2 of the semiconductor wafer 1 via the wiring layer 10a of the wiring board 10, the conductive wires 12, and the probe terminals 14, whereby each of the semiconductor integrated circuit elements formed in the semiconductor wafer 1 are evaluated for electric characteristics.

When the evaluation of the electric characteristics of each of the semiconductor integrated circuit elements formed in the semiconductor wafer 1 is completed, if the sealed space defined by the wafer tray, the seal member, and the elastic sheet 13 is released from evacuation, the elastic sheet 13 moves toward the wiring board 10 and returns to the original state. In this case, however, the conductive wires 12 return to the original state while keeping contact with the backside portions 14a of the probe terminals 14 because of the elastic deformation of the elastic members 11.

Although the first embodiment has used the two conductive wires 12, the number of conductive wires 12 may be increased or decreased as long as electric continuity is established.

Although the present embodiment has described the case where a wafer-level test is performed with respect to the plurality of semiconductor integrated circuit elements formed in the semiconductor wafer 1 such that the electric characteristics thereof are tested simultaneously, the first embodiment is also applicable to a testing board for testing the electric characteristics of semiconductor packages having semiconductor integrated circuit elements (semiconductor chips) cut out of the semiconductor wafer 1 and covered with resin packages. In this case, the resin packages are designated at a reference numeral 1 in FIGS. 1(a) and 1(b). The upper surfaces of the testing electrodes 2 are substantially flush with the surfaces of the resin packages 1 or slightly protruding therefrom in the absence of the passivation film 3.

Embodiment 2

Figure 2:
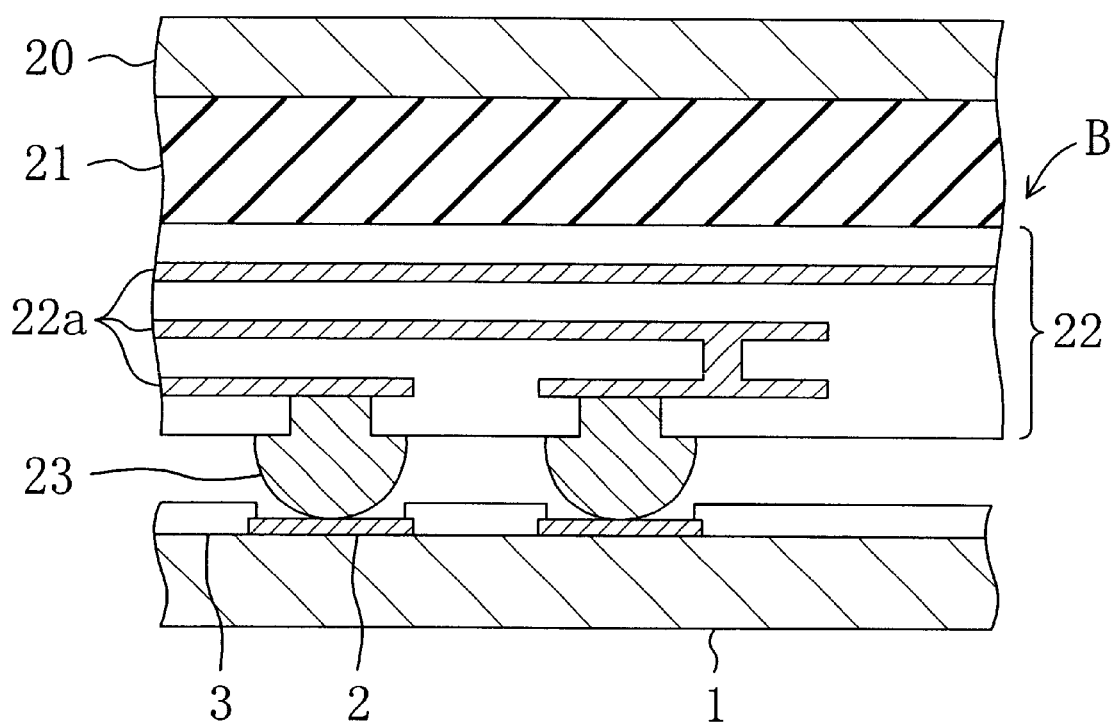
FIG. 2 is a cross-sectional view showing a principal portion of a testing board according to a second embodiment of the present invention.

Referring to FIG. 2, a testing board B according to a second embodiment of the present invention will be described.

FIG. 2 shows a cross-sectional structure of a principal portion of the testing board B according to the second embodiment. FIG. 2 corresponds to the portion enclosed in the dot-dash box in FIG. 5. It is to be noted that a large number of testing electrodes 2 are provided on the surface of a semiconductor wafer 1 formed with a plurality of semiconductor integrated circuit elements and the peripheral portions of the testing electrodes 2 are covered with a passivation film 3, similarly to FIG. 5. However, there are also cases where the peripheral portions of the testing electrodes 2 are not covered with the passivation film 3. The semiconductor wafer 1 is held by a wafer tray having the structure shown in FIG. 5.

As shown in FIG. 2, an elastic member 21 composed of, e.g., a rubber sheet is affixed to the surface of an insulating board 20 composed of a glass plate or the like. A multilayer wiring sheet 22 composed of, e.g., a polyimide sheet internally provided with three wiring layers 22a made of, e.g., copper is affixed to the side of the elastic member 21 opposite to the insulating board 20. Although FIG. 2 shows the case where the three wiring layers 22a are formed within the multilayer wiring sheet 22, the number of wiring layers 22a can be changed depending on the routing of wires or the degree of integration of the testing electrodes 2 of the semiconductor wafer 1.

Probe terminals 23 each consisting of a base portion configured as a short column and a hemispherical bump and formed by plating are disposed on the side (front side) of the multilayer wiring sheet 22 opposing the semiconductor wafer 1 to correspond to the testing electrodes 2.

Thus, the testing board B is composed of: the insulating board 20; the elastic member 21; the multilayer wiring sheet 22; and the probe terminals 23.

Similarly to the description given above with reference to FIG. 5, if the wafer tray holding the semiconductor wafer 1 and the insulating board 20 of the testing board B are brought closer to each other, a sealed space is defined by the wafer tray, the seal member provided in the seal member, and the multilayer wiring sheet 22. If the sealed space is evacuated, the wafer tray and the multilayer wiring sheet 22 are brought much closer to each other, so that the testing electrodes 2 of the semiconductor wafer 1 held by the wafer tray and the probe terminals 23 of the testing board B are connected to each other. It is to be noted that the amount of vertical travel (up-and-down travel in FIG. 2) of the probe terminals 23 caused by the evacuation of the sealed space defined by the wafer tray, the seal member, and the multilayer wiring sheet 22 and the release of the evacuation can be accommodated by elastic deformation of the elastic member 21.

In this state, a testing voltage is applied from a testing apparatus to each of the testing electrodes 2 of the semiconductor wafer 1 via the wiring layer 22a of the multilayer wiring sheet 22 and the probe terminals 23, whereby each of the semiconductor integrated circuit elements formed in the semiconductor wafer 1 are evaluated for electric characteristics.

Although the present embodiment has described the case where a wafer-level test is performed with respect to the plurality of semiconductor integrated circuit elements formed in the semiconductor wafer 1 such that the electronic characteristics thereof are tested simultaneously, the second embodiment is also applicable to a testing board for testing the electric characteristics of semiconductor packages having semiconductor integrated circuit elements (semiconductor chips) cut out of the semiconductor wafer 1 and covered with resin packages. In this case, the resin packages are designated at a reference numeral 1 in FIG. 2. The upper surfaces of the testing electrodes 2 are substantially flush with the surfaces of the resin packages 1 or slightly protruding therefrom in the absence of the passivation film 3.

Embodiment 3

Figure 3:
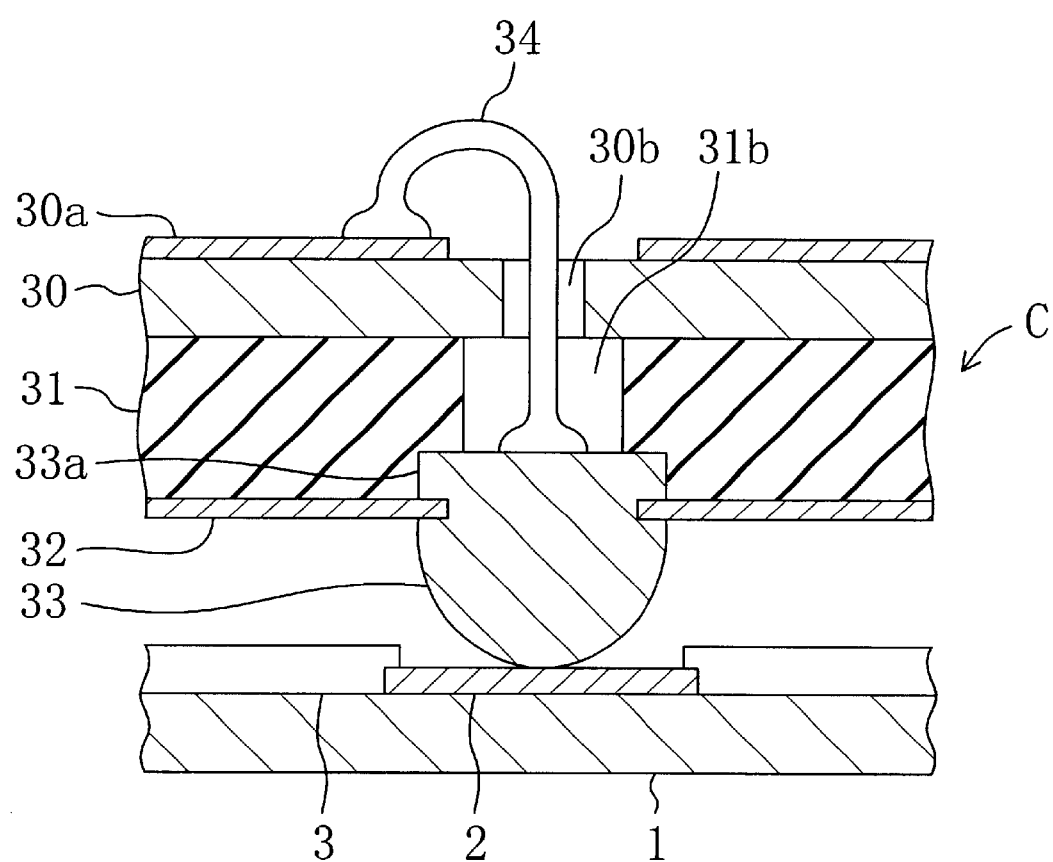
FIG. 3 is a cross-sectional view showing a principal portion of a testing board according to a third embodiment of the present invention.

Referring to FIG. 3, a testing board C according to a third embodiment of the present invention will be described.

FIG. 3 shows a cross-sectional structure of a principal portion of a testing board C according to the third embodiment. FIG. 3 corresponds to the portion enclosed in the dot-dash box in FIG. 5. It is to be noted that a large number of testing electrodes 2 are provided on the surface of a semiconductor wafer 1 formed with a plurality of semiconductor integrated circuit elements and the peripheral portions of the testing electrodes 2 are covered with a passivation film 3, similarly to FIG. 5. However, there are also cases where the peripheral portions of the testing electrodes 2 are not covered with the passivation film 3. The semiconductor wafer 1 is held by a wafer tray having the structure shown in FIG. 5.

As shown in FIG. 3, an elastic member 31 composed of a rubber sheet or the like is affixed to the surface (lower surface) of an insulating board 30 composed of a glass plate or the like. A wiring layer 30a composed of, e.g., copper is formed on the back surface (upper surface) of the insulating board 30.

An elastic sheet 32 composed of, e.g., a polyimide sheet is affixed to the side of the elastic member 31 opposite to the insulating board 30 such that the probe terminals 33 are held by the elastic sheet 32. In this case, hemispherical probe terminals 33 are formed by plating on the side (front side) of the elastic sheet 32 opposing the semiconductor wafer 1 to correspond to the testing electrodes 2. The probe terminals 33 have backside portions 33a expanding laterally over the back side of the elastic sheet 32 after extending through the elastic sheet 32. With the elastic sheet 32 held between the main body portion and backside portions 33a of the probe terminals 33, the probe terminals 33 are held by the elastic sheet 32.

A first opening 30b and a second opening 31b are formed in the respective portions of the insulating board 30 and the elastic member 31 each opposing the backside portion 33a of each of the probe terminals 33. The wiring layer 30a of the insulating board 30 and the backside portion 33a of each of the probe terminals 33 are connected to each other with a conductive wire 34 extending through the first and second openings 30b and 31b. The conductive wire 34 may have ends connected to the wiring layer 30a of the insulating board 30 and to the backside portion 33a of the probe terminal 33 by, e.g., wire bonding or like method.

Thus, the testing board C is composed of: the insulating board 30 having the wiring layer 30a; the elastic member 31; the elastic sheet 32; and the probe terminal 33.

Similarly to the description given above with reference to FIG. 5, if the wafer tray holding the semiconductor wafer 1 and the insulating board 30 are brought closer to each other, a sealed space is defined by the wafer tray, the seal member provided on the seal member, and the elastic sheet 32. If the sealed space is evacuated, the wafer tray and the elastic sheet 32 are brought much closer to each other, so that the testing electrodes 2 of the semiconductor wafer 1 held by the wafer tray and the probe terminals 33 of the testing board C are connected to each other. It is to be noted that the amount of vertical travel (up-and-down travel in FIG. 3) of the probe terminals 33 caused by the evacuation of the sealed space defined by the wafer tray, the seal member, and the elastic sheet 32 and the release of the evacuation can be accommodated by elastic deformation of the elastic member 31.

Although the present embodiment has described the case where a wafer-level test is performed with respect to the plurality of semiconductor integrated circuit elements formed in the semiconductor wafer 1 such that the electronic characteristics thereof are tested simultaneously, the third embodiment is also applicable to a testing board for testing the electric characteristics of semiconductor packages having semiconductor integrated circuit elements (semiconductor chips) cut out of the semiconductor wafer 1 and covered with resin packages. In this case, the resin packages are designated at a reference numeral 1 in FIG. 3. The upper surfaces of the testing electrodes 2 are substantially flush with the surfaces of the resin packages 1 or slightly protruding therefrom in the absence of the passivation film 3.

Embodiment 4

Figure 4:
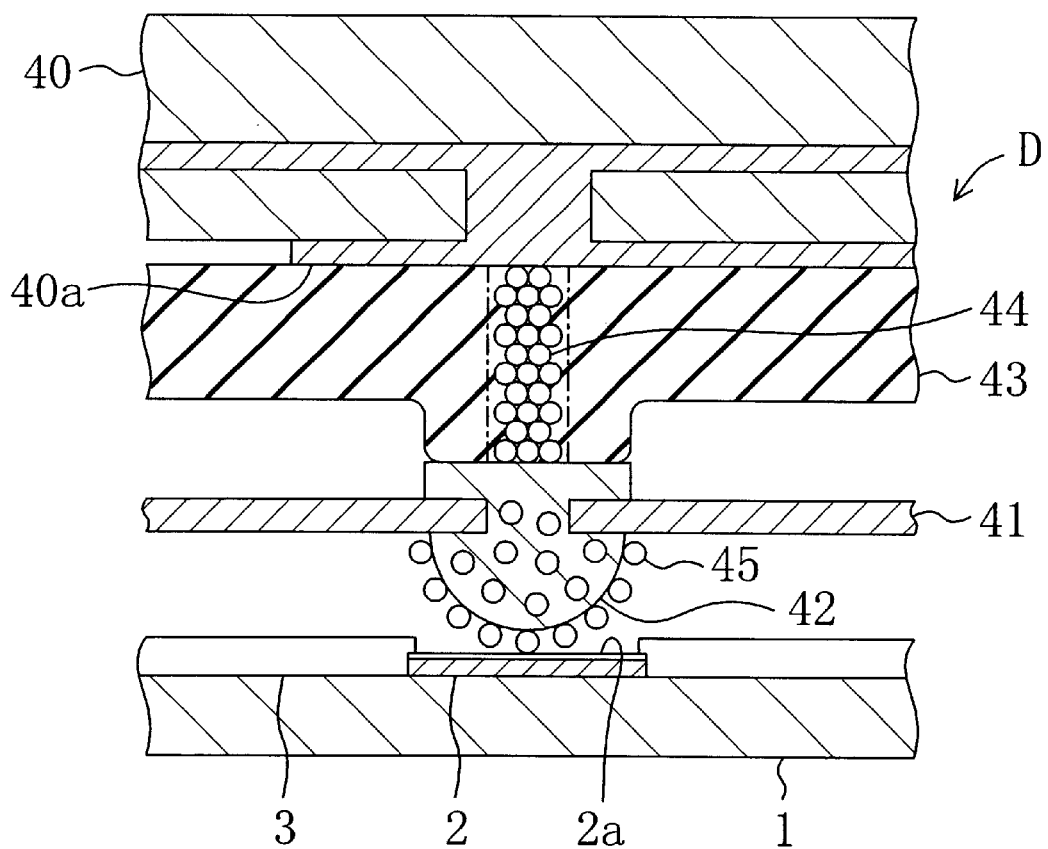
FIG. 4 is a cross-sectional view showing a principal portion of a testing board according to a fourth embodiment of the present invention.

Referring to FIG. 4, a testing board D according to a fourth embodiment of the present invention will be described.

FIG. 4 shows a cross-sectional structure of a principal portion of a testing board D according to the fourth embodiment. FIG. 4 corresponds to the portion enclosed in the dot-dash box in FIG. 5. It is to be noted that a large number of testing electrodes 2 are provided on the surface of a semiconductor wafer 1 formed with a plurality of semiconductor integrated circuit elements and the peripheral portions of the testing electrodes 2 are covered with a passivation film 3, similarly to FIG. 5. However, there are also cases where the peripheral portions of the testing electrodes 2 are not covered with the passivation film 3. The semiconductor wafer 1 is held by a wafer tray having the structure shown in FIG. 5.

The testing board D comprises: a wiring board 40 having a wiring layer 40a; an elastic sheet 41 composed of, e.g., a polyimide sheet fixed to the wiring board 40; hemispherical probe terminals 42 disposed at the elastic sheet 41 to correspond to the testing electrodes 2 on the semiconductor wafer 1; and an anisotropic conductive rubber sheet 43 for providing electric connections between the wiring layer 40a of the wiring board 40 and the probe terminals 42. Numerous conductive particles 44a are provided in the anisotropic conductive rubber sheet 43 in mutually connected relation, which provides electric connections between the wiring layer 40a of the wiring board 40 and the probe terminals 42.

The numerous conductive particles 43 are not only adhered to the surface of the probe terminals 42 but also buried in the probe terminals 42. The probe terminals 42 are preferably composed of a material that can be grown by electrolytic plating, such as nickel or copper. The conductive particles 45 are preferably composed of a material having comparatively high hardness and excellent adhesion to the material composing the probe terminals 42, such as silicon carbide, nickel, an industrial diamond piece, or alumina particles. Preferably, the conductive particle 45 has a sharp surface configuration.

According to the fourth embodiment, since the conductive particles 45 are adhered to the tip surfaces of the probe terminals 42, coatings 2a composed of a natural oxide film or contaminant film are torn by the particles 45. This ensures contact between the probe terminals 42 and the testing electrodes 2.

Since the conductive particles 45 are also buried in the probe terminals 42, the particles 45 buried in the probe terminals 42 are exposed successively even if the tip surfaces of the probe terminals 42 are abraded and the particles 45 come off. This ensures contact between the probe terminals 42 and the testing electrodes 2 over a long period of time.

Although the fourth embodiment has used the testing board having the anisotropic conductive rubber sheet 43, similarly to the conventional embodiment, and provided the conductive particles 45 on the surface of the probe terminals 42 of the testing board and in the inside thereof, it is also possible to use the testing boards according to the first to third embodiments and provide the conductive particles 45 on the surfaces of the probe terminals 14, 23, and 33 and in the inside thereof. Alternatively, the conductive particles 45 may be adhered to at least the tip surfaces of the probe terminals 14, 23, and 33.

What is claimed is:

1. A testing board for testing electric characteristics of semiconductor integrated circuit elements by applying a voltage to each of testing electrodes of said semiconductor integrated circuit elements, said testing board comprising:

a wiring board having a wiring layer on a surface thereof opposing said semiconductor integrated circuit elements;

an elastic sheet disposed in spacing relation to the opposing surface of said wiring board;

probe terminals disposed on a surface of said elastic sheet opposing said semiconductor integrated circuit elements to correspond to said testing electrodes;

a conductive wire having both end portions joined to the wiring layer of said wiring board and a middle portion spaced from the opposing surface of said wiring board; and an elastic member disposed between said wiring board and said conductive wire to bias said conductive wire such that the middle portion of the conductive wire is brought in contact with the corresponding one of said probe terminals.

2. A testing board for testing electric characteristics of semiconductor integrated circuit elements by applying a voltage to each of testing electrodes of said semiconductor integrated circuit elements, said testing board comprising:

a main board;

an elastic wiring sheet disposed on a surface of said main board opposing said semiconductor integrated circuit elements and internally formed with a wiring layer; and probe terminals disposed on a surface of said wiring sheet opposing said semiconductor integrated circuit elements to correspond to said testing electrodes, said probe terminals being electrically connected to the wiring layer of said wiring sheet.

3. The testing board according to claim 2, further comprising an elastic member located between said main board and said wiring sheet.

4. A testing board for testing electric characteristics of semiconductor integrated circuit elements by applying a voltage to each of testing electrodes of said semiconductor integrated circuit elements, said testing board comprising:

a wiring board having a wiring layer on a surface thereof opposite to said semiconductor integrated circuit elements;

an elastic sheet disposed on a surface of said wiring board opposing said semiconductor integrated circuit elements;

probe terminals disposed on a surface of said elastic sheet opposing said semiconductor integrated circuit elements to correspond to said testing electrodes; and a conductive wire extending through said wiring board and connecting the corresponding one of said probe terminals to the wiring layer of said wiring board.

5. The testing board according to claim 4, further comprising an elastic member located between said wiring board and said elastic sheet.

6. A testing board for testing electric characteristics of semiconductor integrated circuit elements by applying a voltage to each of testing electrodes of the semiconductor integrated circuit elements, said testing board comprising:

a wiring board or wiring sheet having a wiring layer; and probe terminals disposed on a surface of said wiring board or wiring sheet opposing said semiconductor integrated circuit elements to correspond to said testing electrodes, said probe terminals being electrically connected to said wiring layer, conductive particles being adhered to at least a tip surface of each of said probe terminals.

7. The testing board according to claim 6, wherein said conductive particles are also provided within each of said probe terminals.

* * * * *